United States Patent [19]
Liao et al.

[11] Patent Number: 5,407,841
[45] Date of Patent: Apr. 18, 1995

[54] CBICMOS FABRICATION METHOD USING SACRIFICIAL GATE POLY

[75] Inventors: Kuan-Yang Liao, Laguna Niguel; Maw-Rong Chin, Huntington Beach; Pen C. Chou, Tustin; Kirk R. Osborne, Los Angeles, all of Calif.

[73] Assignee: Hughes Aircraft Company, Los Angeles, Calif.

[21] Appl. No.: 968,910

[22] Filed: Oct. 30, 1992

[51] Int. Cl.$^6$ .......................................... H01L 21/265
[52] U.S. Cl. ...................... 437/31; 437/34; 437/59; 437/162; 148/DIG. 9
[58] Field of Search .............. 437/31, 59, 60, 190, 437/192, 162, 918, 56, 55; 148/DIG. 9, DIG. 136

[56]  References Cited

U.S. PATENT DOCUMENTS

| 3,649,945 | 3/1972 | Waits | 427/103 |
|---|---|---|---|
| 4,735,916 | 4/1988 | Homma et al. | 437/162 |
| 4,784,971 | 11/1988 | Chiu et al. | 437/162 |
| 5,015,594 | 5/1991 | Chu et al. | 437/162 |
| 5,041,191 | 8/1991 | Watson | 437/192 |
| 5,043,295 | 8/1991 | Ruggerio et al. | 437/918 |
| 5,091,322 | 2/1992 | Maeda et al. | 148/DIG. 9 |
| 5,196,356 | 3/1993 | Won et al. | 437/59 |

OTHER PUBLICATIONS

Charles M. Hochstedler, "The BiCMOS Edge: Fast Speed and Low Power", Semiconductor International, Apr. 1989, pp. 68–71.
Alvarez et al., "Tweaking BiCMOS Circuits By Optimizing Device Design", semiconductor international, May 1989, pp. 226–232.
Haken et al., "Solving the Process Integration Challenges of BiCMOS", Semiconductor International, May 1989, pp. 240–245.
Haken et al., BiCMOS Processes for Digital and Analog Devices:, Semiconductor International, Jun. 1989 96–100.
Cosentino et al., "Motorola's BiCMOS Process", Semiconductor International, Jun. 1989, p. 102.
Richards et al., "Fujitsu's BiCMOS Process", Semiconductor International, Jun. 1989, p. 104.
Lee et al., "BiCMOS Technology for High Performance VLSI Circuits", VLSI Design, Aug. 1984, pp. 98–100.
Kubo et al, "Perspective on BiCMOS VLSI's", IEEE Journal of Solid–State Circuits, vol. 23, No. 1, Feb. 1988, pp. 5–11.
Chiu et al., "Non-overlapping Super Self-Aligned BiCMOS with 87 ps Los Power ECL", IEDM, 1988, pp. 752–755.
Chapman et al.,"Submicron BiCMOS Well Design For Optimum Circuit Performance", IEDM, 1988, pp. 756–759.
Kobayashi et al., "High Performance LSI Process Technology: SST CBICMOS", IEDM, 1988, pp. 760–763.

(List continued on next page.)

Primary Examiner—Tom Thomas
Assistant Examiner—Tuan Nguyen
Attorney, Agent, or Firm—Georgann S. Grunebach; Terje Gudmestad; W. K. Denson-Low

[57]  ABSTRACT

A complementary bipolar CMOS fabrication method uses a common deposition for both the CMOS gate contacts, and as a sacrificial layer for patterning bipolar devices. The deposition is removed from the bipolar devices and, after implanting base and emitter regions, is replaced with a separate emitter contact. Prior to its removal the sacrificial layer is coated with an oxidation resistant layer that imparts a desirable rounded shape to the edge of a thermal oxide layer that is grown around the bipolar emitter area. Common mask and implant steps are also used to fabricate lightly doped CMOS drains together with bipolar base-link regions, and CMOS source/drain regions together with bipolar external base regions. The fabrication technique also facilitates the fabrication of capacitors with no additional steps required, and includes an improved NiCr resistor contact method.

11 Claims, 6 Drawing Sheets

OTHER PUBLICATIONS

Zimmer et al., "BiCMOS: technology and circuit design", Microelectronics Journal, vol. 20, Nos. 1–2, 1989 Elsevier Science Publishers Ltd., England, pp. 59–75.

Deferm et al., "Latch-up in a BiCMOS Technology", IEDM, 1988, pp. 130–133.

Verdonckt-Vandebroek et al., "High Gain Lateral Bipolar Transistor", IEDM, 1988, pp. 406–409.

Goodman et al., "Complementary BMOS/BiCMOS Technology For Power IC Application", IEDM 1988, pp. 786–799.

Sakui et al., "A new Static Memory Cell Based on Reverse Base Current (RBC) Effect of Bipolar Transistor", IEDM, 1988, pp. 44–45.

Yuzurika et al., "Submicron Bipolar-CMOS Technology Using 16 GHzf,Double Poly-Si Bipolar Devices", IEDM, 1988, pp. 748–751.

Brassington et al., "An Advanced Single-Level Polysilicon Submicrometer BiCMOS Technology", IEEE Transactions on Electron Devices, vol. 36, No. 4 pp. 712–719.

Kobayashi et al., "Bipolar CMOS-merged Technology for a High-Speed 1-Mbit DRAM", IEEE Transactions on Electron Devices, vol. 36, No. 4, Apr. 1989 pp. 706–711.

Doyle et al., "Circuit Modeling of Bipolar Transistor for BiCMOS" IEEE Journal of Solid-State Circuits, vol. 24, No. 1, Feb. 1989, pp. 189–193.

Rosseel et al., "influence of Device Parameters on the Switching Speed of BiCMOS Buffers", IEEE Journal of Solid-State Circuits, vol. 24, No. 1 Feb. 1989, pp. 90–99.

Kertis et al., "A 12-ns ECL I/0256Kx1-bit SRAM Using a 1-pm BiCMOS Technology", IEEE Journal of Solid-State Circuits, vol. 23, No. 5, Oct. 1988 pp. 1048–1053.

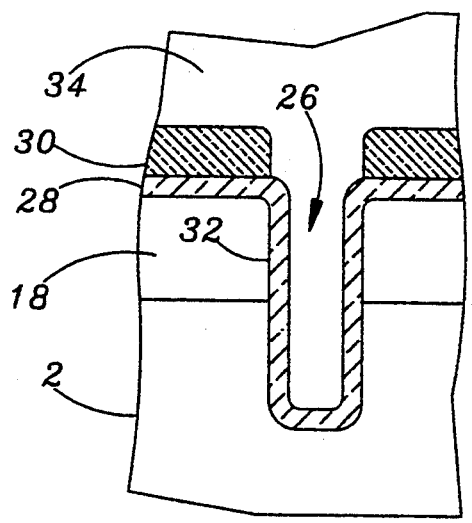 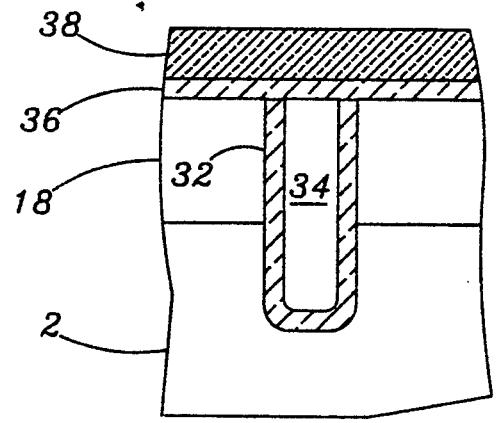
FIG. 3          FIG. 4
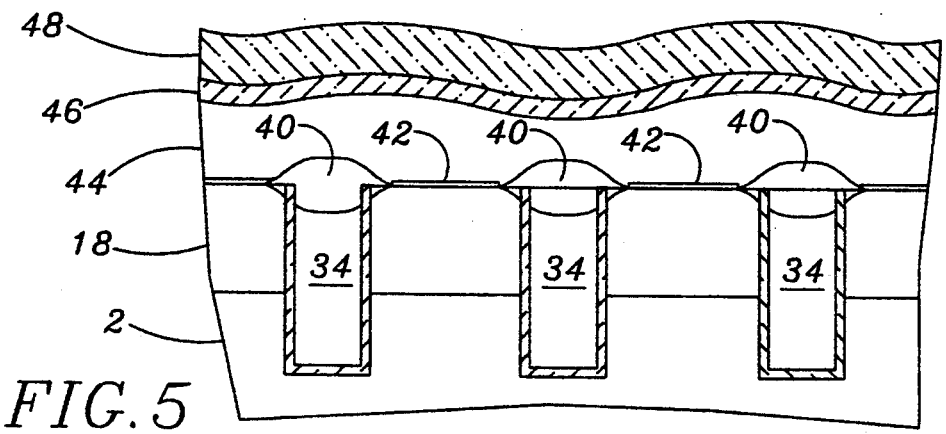
FIG. 5
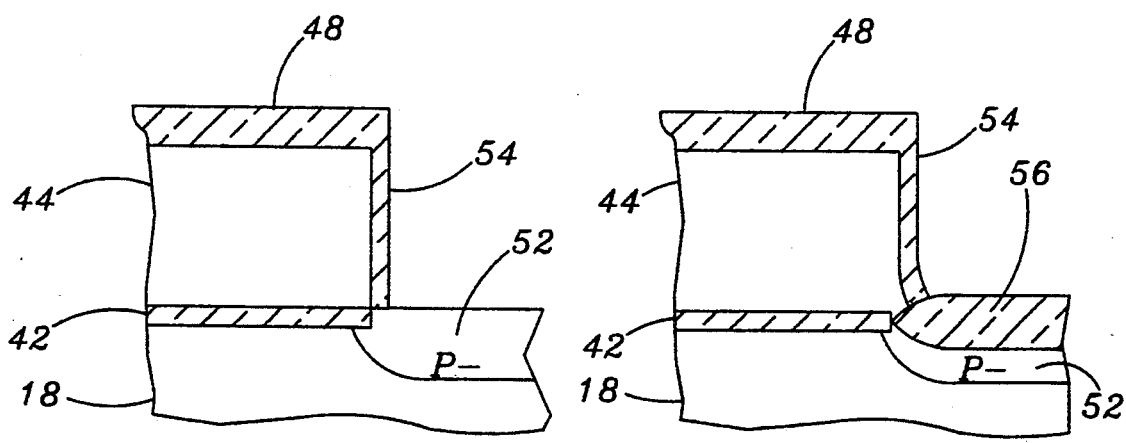
FIG. 8a          FIG. 8b

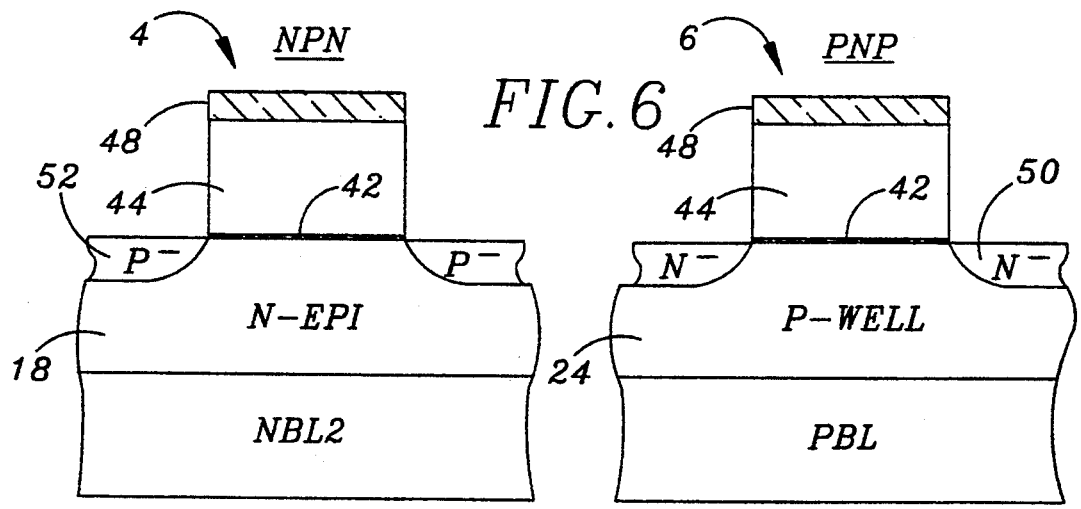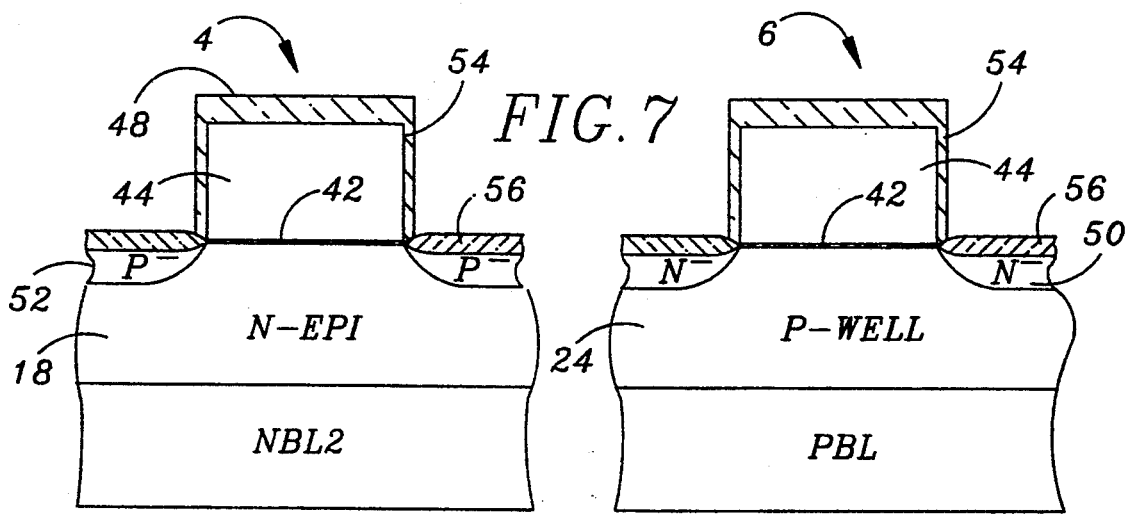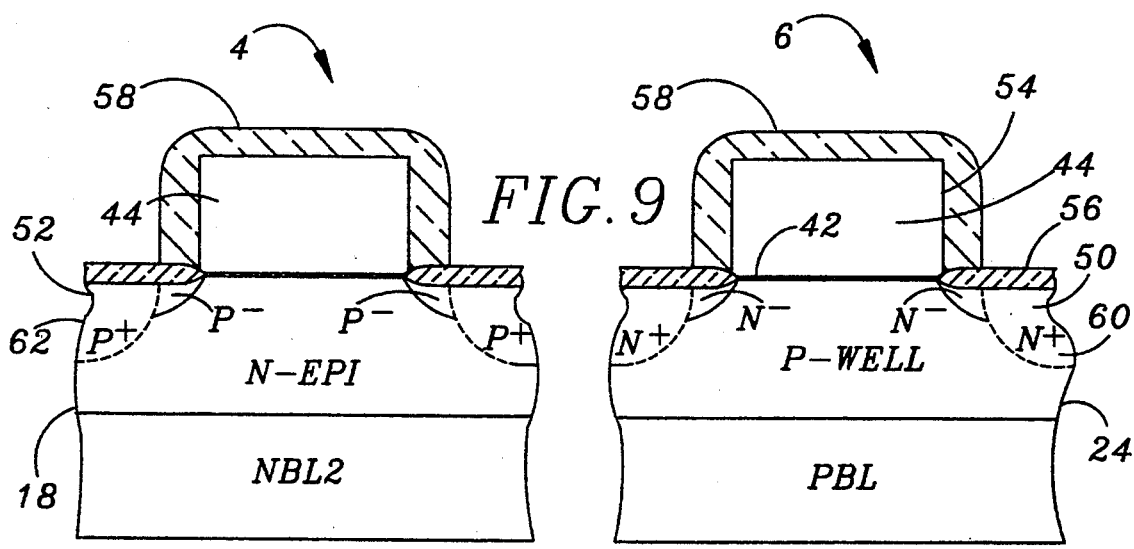

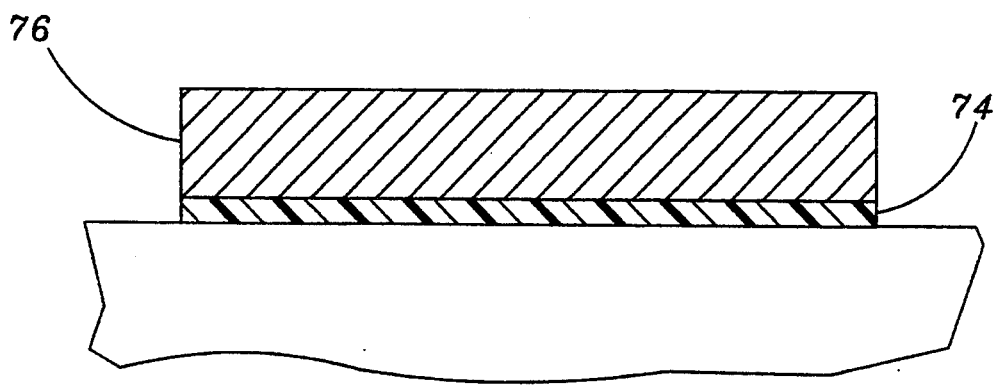
FIG. 13a
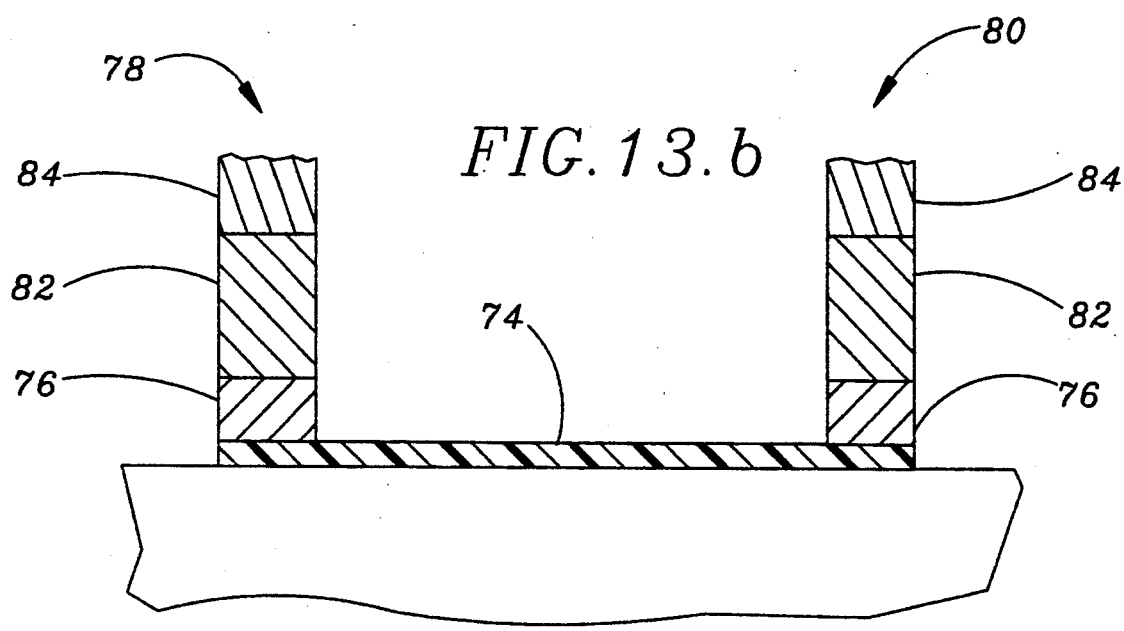
FIG. 13.b

CBICMOS FABRICATION METHOD USING SACRIFICIAL GATE POLY

BACKGROUND OF THE INVENTION

1. Field of the Invention

This invention relates to the fabrication of self-aligned complementary bipolar and complementary metal oxide semiconductor (CBiCMOS) transistors on the same substrate in a common fabrication method, and more particularly to CBiCMOS fabrication techniques in which some of the process steps are used simultaneously for both the bipolar and MOS fabrication, thereby reducing the total number of steps. The invention also relates to a compatible precision resistor fabrication technique.

2. Description of the Related Art

Several BiCMOS fabrication processes have been developed to provide bipolar and CMOS devices on the same wafer. Examples of such processes are described in Charles M. Hochstedler, "The BiCMOS Edge: Fast Speed and Low Power", *Semiconductor International,* April 1989, pages 68–71; Alvarez et al., "Tweaking BiCMOS Circuits By Optimizing Device Design", *semiconductor international,* May 1989, pages 226–232; Haken et al., "Solving the Process Integration Challenges of BiCMOS", *Semiconductor international,* May 1989, pages 240–245; Haken et al., "BiCMOS Processes for Digital and Analog Devices", *Semiconductor International,* June 1989, pages 96–100; Cosentino et al., "Motorola's BiCMOS Process", *Semiconductor International,* June 1989, page 102; Richards et al., "Fujitsu's BiCMOS Process", *Semiconductor International,* June 1989, page 104; Lee et al., "Bi-CMOS Technology for High-Performance VLSI Circuits", *VLSI Design,* August 1984, pages 98–100; Kubo et al., "Perspective on BiCMOS VLSI's", *IEEE Journal of Solid-State Circuits,* Vol. 23, No. 1, Feb. 1988, pages 5–11; Chiu et al., "Non-overlapping Super Self-Aligned BiCMOS with 87 ps Low Power ECL", *IEDM,* 1988, pages 752–755; Chapman et al., "Submicron BiCMOS Well Design For Optimum Circuit Performance", *IEDM,* 1988, pages 756–759; Kobayashi et al., "High Performance LSI Process Technology: SST CBI-CMOS", *IEDM,* 1988, pages 760–763; Zimmer et al., "BiCMOS: technology and circuit design", *Microelectronics Journal,* Vol. 20, Nos. 1–2, 1989 Elsevier Science Publishers Ltd., England, pages 59–75; Deferm et al., "Latch-up In a BiCMOS Technology", *IEDM,* 1988, pages 130–133; Verdonckt-Vandebroek et al., "High Gain Lateral Bipolar Transistor", *IEDM,* 1988, pages 406–409; Goodman et al., "Complementary BMOS/BiCMOS Technology For Power IC Application", *IEDM,* 1988, pages 796–799; Sakui et al., "A New Static Memory Cell Based on Reverse Base Current (RBC) Effect of Bipolar Transistor", *IEDM,* 1988, pages 44–45; Yuzuriha et al., Submicron Bipolar-CMOS Technology Using 16 GHzf$_T$ Double Poly-Si Bipolar Devices", *IEDM,* 1988, pages 748–751; Brassington et al., "An Advanced Single-Level Polysilicon Submicrometer BiCMOS Technology", *IEEE Transactions on Electron Devices,* Vol. 36, No. 4, Apr. 1989, pages 712–719; Kobayashi et al., "Bipolar CMOS-merged Technology for a High-Speed 1-Mbit DRAM", *IEEE Transactions on Electron Devices,* Vol. 36, No. 4, Apr. 1989, pages 706–711; Doyle et al., "Circuit Modeling of Bipolar Transistor for BiCMOS", *IEEE Journal of Solid-State Circuits,* Vol. 24, No. 1, Feb. 1989, pages 189–193; Rosseel et al., "Influence of Device Parameters on the Switching Speed of BiCMOS Buffers", *IEEE Journal of Solid-State Circuits,* Vol. 24, No. 1, Feb. 1989, pages 90–99; and Kertis et al, "A 12-ns ECL I/0256K×1-bit SRAM Using a 1-μm BiCMOS Technology", *IEEE Journal of Solid-State Circuits,* Vol. 23, No. 5, Oct. 1988, pages 1048–1053. These types of circuits are useful in applications such as high performance and high precision analog/digital mixed signal processing.

As with circuit processing in general, in CBiCMOS fabrication it is always desirable to reduce the number of fabrication steps required. For example, separate series of process steps have previously been required to form the CMOS gates and the bipolar emitter and base regions. The bipolar base and emitter regions have themselves been formed separately, which not only adds to the process steps required but also can result in a degradation of the emitter-base breakdown voltage. Excessive substrate-to-collector capacitance has also been a problem, limiting the bipolar transistor's speed of response and consequently the attainable bandwidth.

Another problem has been a tendency to form a sharp discontinuity in the dopant concentration at the edge of the emitter region, which leads to abrupt changes in the electric field in this area and a consequent lowering of the emitter-base breakdown voltage. It would be preferable to have a more gradual dopant gradient at the edge of the emitter region, with an accompanying smoothing out of the electric field gradient.

NiCr resistors have also been employed in the fabrication of CBiCMOS circuitry. While providing good resistance characteristics, this material produces a high contact resistance to metallization contacts that can increase the effective overall resistance beyond design values. It would therefore be highly desirable to retain the advantageous resistance properties of NiCr, but to reduce the level of associated contact resistance.

SUMMARY OF THE INVENTION

The present invention seeks to improve the device performance and process yield of CBiCMOS technology, and in so doing to provide for a self-aligned emitter-base junction that improves the total base resistance and emitter-base breakdown voltage, to reduce the substrate-collector capacitance, and also to reduce the contact resistance to NiCr resistors.

In the accomplishment of these goals, polysilicon filled trench isolation is used to isolate each device. Common gate contact layers, preferably of polysilicon, are formed over both the bipolar transistor emitter and CMOS transistor gate areas of a semiconductor substrate. The polysilicon is retained over the gate area as a CMOS gate contact, while for the bipolar devices it first serves as an implantation mask for a lateral base-link between intrinsic and external base regions. A non-oxidizable spacer layer is then formed around the vertical sides of the emitter polysilicon and the substrate is heated to form a thermal oxide layer, using the spacer layer as an oxidation mask for the emitter area. The spacer layer constrains the thermal oxide layer to terminate in a rounded profile with a central peak (generally referred to in the industry as a "bird's-beak" profile), that smoothes out the dopant gradient at the edge of the emitter region when it is later implanted, and thereby smoothes the electric field gradient in this area. An implantation mask is then formed over the emitter polysilicon and used to pattern an external base region, followed by removal of the mask, spacer layer and emitter polysilicon.

The emitter polysilicon is preferably formed over a previously established CMOS gate oxide layer; this layer is removed from the bipolar emitter area (but not from the CMOS devices) when the emitter polysilicon has been removed. Vertically self-aligned base and emitter regions can now be implanted to form the intrinsic base, using the thermal oxide layer as a patterning mask. A second emitter polysilicon layer deposition follows, which becomes doped during the emitter implantation to serve as an emitter contact.

The invention further contemplates the provision of NiCr resistors on the same substrate. A thin film of NiCr is deposited on the substrate surface, followed by a thicker layer of TiW over the NiCr film, and then patterning of a desired resistor geometry. A metallized contact to the TiW layer, rather than directly to the NiCr film, results in a significantly lower contact resistance.

The invention is applicable to the fabrication of either complementary bipolar transistors or bipolar transistors of uniform polarity along with the CMOS transistors, and can also be used to fabricate bipolar transistors without any CMOS devices at all. The dual use of the CMOS gate polysilicon to also assist in the formation of a self-aligned emitter-base junction eliminates several process steps, while the use of a very high resistance epitaxial layer together with the device scalability made possible by the invention results in a reduction in the substrate-collector capacitance.

Further features and advantages of the invention will be apparent to those skilled in the art from the following detailed description, taken together with the accompanying drawings.

BRIEF DESCRIPTION OF THE DRAWINGS

FIGS. 3 and 4 are fragmentary sectional views illustrating different stages in the fabrication of isolation trenches between adjacent devices of the BiCMOS circuit;

FIG. 5 is a sectional view illustrating adjacent device regions separated by isolation trenches and field oxide layers, after the deposition of gate oxide and gate contact layers;

FIGS. 6 and 7 are fragmentary sectional views illustrating an initial sequence used to form self-aligned base and emitter regions for the bipolar devices;

FIGS. 8a and 8b are enlarged fragmentary views illustrating the establishment of a shaped profile at the termination of a thermal oxide layer, used subsequently in patterning the bipolar base and emitter regions;

FIGS. 9-11 are fragmentary sectional views illustrating further stages in the completion of the bipolar base and emitter regions;

FIGS. 13a-13b are fragmentary sectional views illustrating successive stages in the fabrication of a low contact resistance NiCr resistor on the same substrate with the BiCMOS devices.

DETAILED DESCRIPTION OF THE INVENTION

Figures 1, 2:
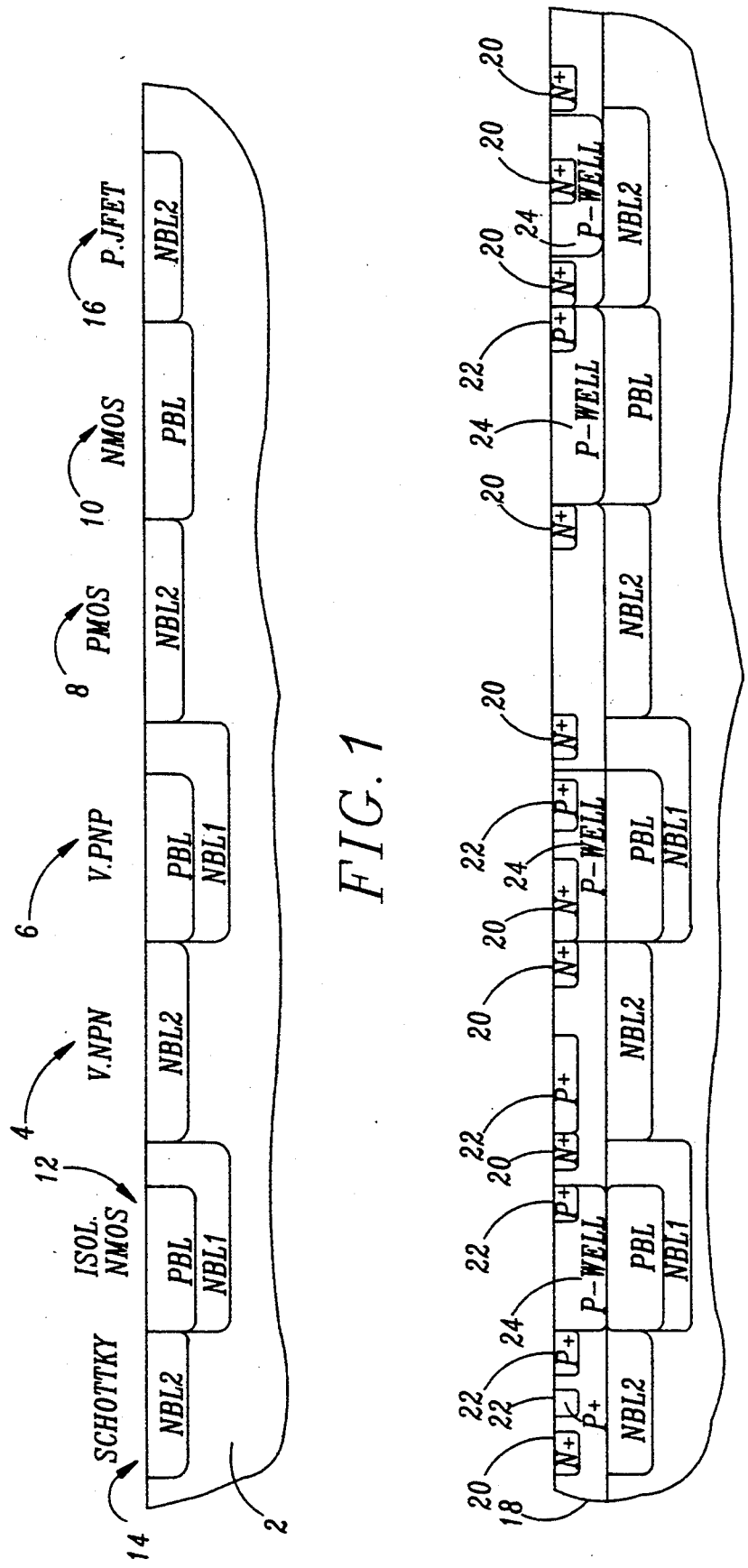
FIGS. 1 and 2 are simplified sectional views illustrating successive stages in the fabrication of a BiCMOS circuit in accordance with the invention.

An early stage in the fabrication of a BiCMOS circuit in accordance with the invention is shown in FIG. 1. The circuit is fabricated on a semiconductor substrate 2, which in the illustration discussed herein is silicon but could also be another semiconductor material such as GaAs or InP. The devices to be fabricated in this illustration are a vertical NPN bipolar transistor 4, a vertical PNP bipolar transistor 6, a P-channel MOS transistor 8, an N-channel MOS transistor 10, an isolated N-channel MOS transistor 12, a Schottky diode 14 and a P-channel junction field effect transistor (JFET) 16. To arrive at the early fabrication stage shown in FIG. 1, the substrate is first masked and an N-doped buried layer NBL1 is implanted and driven-in to provide isolation for both the vertical PNP device 6 and the isolated N-MOS device 12. Another N-doped buried layer NBL2 is then implanted through a second mask and driven-in for the collector of NPN device 4 and the P-MOS device 8. Thermally driving in the NBL2 layers also drives the NBL1 layers deeper into the substrate. NBL2 buried layers are provided at the same time for the Schottky diode 14 and JFET 16. To complete the fabrication stage shown in FIG. 1, P-doped buried layers PBL are formed for the collector of PNP device 6 and for the NMOS and isolated NMOS devices 10 and 12 by a P-dopant implant through a third mask, followed by a PBL drive in.

The results of the next several steps in the fabrication process are shown in FIG. 2. An N-doped epitaxial layer 18 is grown over the substrate 2 to a thickness of about 1-3 microns. An oxide layer about 500 Angstroms thick (not shown in FIG. 2) is grown over the epitaxial layer. N+ and P+ implants 20 and 22 are then made in succession through respective N+ and P+ sink masks into each of the devices as shown. P-wells 24 are next established in the PNP, NMOS, JFET and isolated NMOS devices by a P-well implant through an appropriate mask, followed by a P-well drive-in that also drives in the N+ and P+ sink implants 20 and 22.

Although not shown in FIG. 2, each of the devices is separated from the adjacent devices by an isolation trench and field oxide layers. The establishment of these isolation structures is illustrated in FIGS. 3-5. The isolation trenches are tied down to a ground voltage reference to assure that no floating areas are present on the wafer.

In FIG. 3 an isolation trench 26 is etched through a trench mask into the epitaxial layer 18 and substrate 2 between adjacent devices (not shown). The upper surface of the epitaxial layer on each side of the trench is coated with the 500 Angstrom oxide layer 28 mentioned previously, which in turn is covered with a deposited layer of a masking material such as silicon nitride 30, about 1500 Angstroms thick. The isolation trench 26 is etched through the oxide and $Si_3N_4$ layers 28 and 30, as well as through the epitaxial layer 18 in substrate 2. A cleaning sequence which includes a dry photoresist strip plus a wet photoresist strip and an oxide HF dip, followed by another dry photoresist strip plus a wet photoresist strip, is performed to clean all residues of polymer and oxide along the trench side wall. After cleaning the trench, a hot acid etch using an oxidation agent and an oxide strip agent, is performed to etch about 20 Angstroms of silicon, and then an oxide layer 32 is grown within the trench to a thickness of about 2,000 Angstroms. This is followed by the deposition of undoped polysilicon 34, to a thickness of about 1.5 microns, over the entire substrate and filling the trench 26.

A later stage in the trench fabrication is shown in FIG. 4. To reach this stage, the polysilicon 34 is etched off the substrate, except within the trench. The silicon nitride layer 30 and pre-well oxide layer 28 are then stripped and replaced with the growth of a new oxide layer 36 over the entire substrate to a depth of about 300 Angstroms. Another silicon nitride deposition 38 is made over the new oxide layer, to a thickness of about 1500 Angstroms.

FIG. 5 shows the results of several further processing steps. The nitride layer 38 of FIG. 4 is etched through a mask to open field oxide areas that extend over respective isolation trenches, with active areas left between the field oxide areas for fabrication of the various transistors. A blanket phosphorous implant is then performed to serve as a channel stop for the CMOS devices, followed by the formation of an enlarged P-well mask. A boron channel stop implant is then performed to establish a P-doping level that overcomes the n-doping effect of the prior phosphorous implant inside the P-wells, for use in the NMOS and PNP devices. After this a field oxide 40 is grown to a thickness of about 5,000 Angstroms over the isolation trenches. The field oxide penetrates the previously established 300 Angstrom oxide layer, growing below it as well as above. A post field oxide etch is then performed to strip the silicon nitride and oxide layers 38 and 36, followed by the growth of gate oxide layers 42 over the active areas. The gate oxide 42 is grown to about 210 Angstroms thick. Although the gate oxide is ultimately used only for the MOS devices, it is laid down over the active areas for the bipolar devices as well at this stage.

After growing the gate oxide layers 42, a conventional phosphorus implant is made through a mask into the PMOS active area to inhibit voltage punch-through, followed by a conventional voltage threshold adjustment implant into the NMOS and PMOS active areas through another mask. A layer of polysilicon 44 is then deposited over the entire substrate to a thickness of about 4,000 Angstroms, and capped by an oxide layer 46 about 100 Angstroms thick. The polysilicon is next implanted with phosphorous, allowing it to ultimately serve as a gate contact for the CMOS devices. It also serves as an emitter mask during the fabrication of the bipolar devices, as described below; this dual use of the doped polysilicon saves several process steps that would otherwise be required.

Although doped polysilicon is the preferred material for these dual purposes, many other metallic or semi-metallic compounds could be substituted. The use of a metallic compound instead of polysilicon would require a thin dopant implant to later be made into the bipolar transistor emitter areas, about 500 Angstroms deep, to replace a later polysilicon drive-in step. A nitride layer 48 about 1200 Angstroms thick is deposited over the oxide 46 after completion of the polysilicon implant.

Further processing of the bipolar devices is illustrated in FIGS. 6-11. Several of the same processing steps are used for the CMOS devices, and mention of this will be included in the following narration. A distinct advantage of the present invention is that it enables the bipolar and CMOS devices to be formed with the same sequence of process steps, thus reducing the total number of steps required, and improving both yield and cost factors.

A later stage in the fabrication of the NPN and PNP bipolar devices 4 and 6 is shown in FIG. 6. An etch of the polysilicon layer 44, poly oxide 46 and silicon nitride 48 is performed through an appropriate mask to remove these layers except in the areas over the bipolar emitter regions (shown in FIG. 6), the base contact regions (not shown), and the CMOS gate regions (described below in connection with FIG. 12). The emitter regions and base contact regions for the bipolar devices are left covered with a gate oxide layer 42, gate contact polysilicon layer 44, and nitride layer 48 (the thin oxide layer 46 is not shown in FIG. 6 for simplicity). A residual portion of the gate oxide layer also survives the polysilicon/nitride etch in the bipolar active area surrounding the emitter area, but this is incorporated into the thermal oxide described below.

With the polysilicon and nitride layers 44 and 48 serving as a mask for the bipolar emitter and CMOS gate areas, a light N-doping implant is performed to establish a lateral base region 50 for the PNP bipolar device 6 and a drain for the NMOS device, followed by a light P-doping through another mask to establish a lateral base region 52 for the NPN bipolar device and a drain for the PMOS device.

In the next step, illustrated in FIG. 7, a silicon nitride deposition is performed to a thickness of about 300 Angstroms, and then etched back to form vertical spacer layers 54 that extend around the lateral sides of the gate contact layers 44 for the bipolar devices. The substrate is then heated to oxidize the surface of the epitaxial layer in the bipolar active areas. The silicon nitride spacers 54 act as oxidation masks for the bipolar emitter areas, allowing an oxide layer 56 to grow to a thickness of about 1200 Angstroms over the bipolar surface area surrounding the emitter. Other materials might be found suitable for use as an oxidation mask, but silicon nitride is preferred.

The thin spacer layer 54 serves an important function in shaping the inner edge of the oxide layer 56, so that sharp discontinuities in the electric field at the emitter-spaced junction are later avoided. This feature is illustrated in FIGS. 8a and 8b. FIG. 8a shows the area where the emitter based junction will later be formed in an enlarged scale, immediately prior to the thermal oxidation. When the substrate is heated to form the thermal oxide 56, as illustrated in FIG. 8b, the oxide reacts with the silicon below the silicon nitride spacer 54. This has been found to bow the spacer layer out somewhat, causing the inner edge of the oxidation layer 56 to terminate with a rounded "bird's-beak" profile. This geometric configuration results in a more gradual doping gradient in the emitter-base junction area when the emitter and base doping implants are later performed, and this in turn reduces the sharpness of the electric field gradients encountered in this area. It also reduces the emitter size, which is desirable for high speed bipolar devices.

Continuing In FIG. 9 with the fabrication of the bipolar and CMOS devices, another silicon nitride layer 58 is deposited to a thickness of about 2,000 Angstroms, and etched back so that it remains over and surrounding the gate contact layers 44 for the bipolar devices; it is removed from the areas intended for the bipolar external bases. Polysilicon or some other suitable implantation mask could be substituted for the silicon nitride layer 58, if desired.

The silicon nitride 58 is initially opened over the areas intended for the external base regions of the PNP bipolar transistors, and the source drain regions of the NMOS transistors. This is followed with an n+ implant through a mask to form an external base region 60 for the NPN device, and also sources and drains for the NMOS devices. A P+ mask is then formed with openings that allow an external base region 62 for the NPN bipolar device and source and drain regions for the PMOS device to be established with a P+ implant. At this point the CMOS devices are completed, except for the establishment of metallized contacts, and the fabrication of the bipolar devices is continued.

Figure 10:
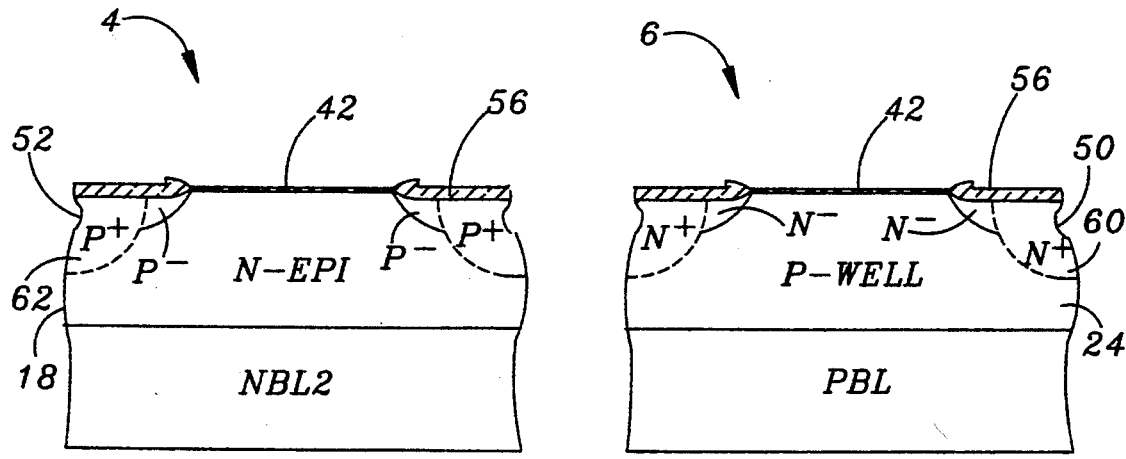
Figure 11:
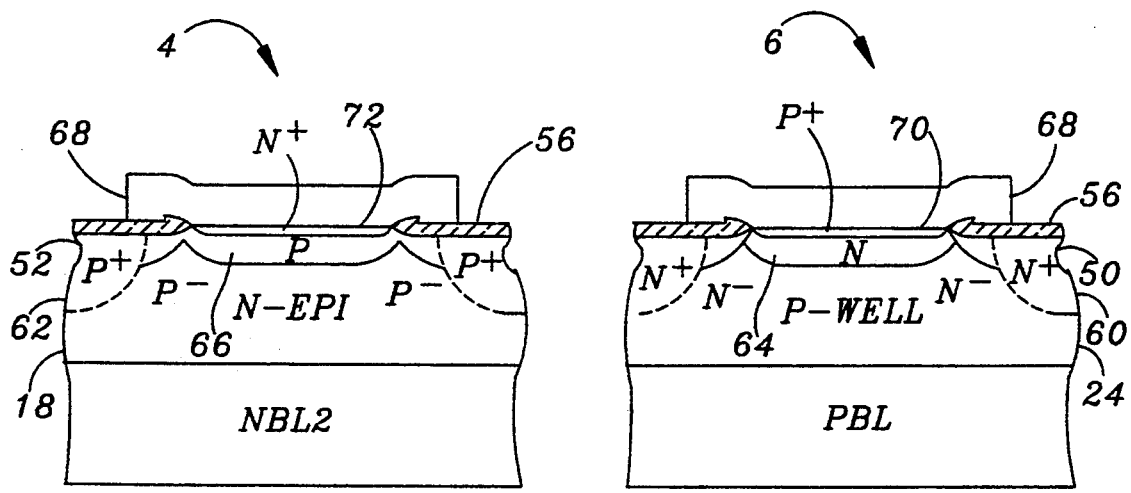

The silicon nitride layer 58 and gate contact layer 54 are next stripped from the bipolar emitter areas, leaving only the thin gate oxide layer 42 over the emitter areas as shown in FIG. 10. This is followed by the formation of a N-base mask, opening the PNP base region, and performing an N-base implant 64 into the PNP transistor 6. After removing this mask, a P-base implant 66 is performed through an opening in another mask for the NPN device 4, as shown in FIG. 11. The gate oxide layers 42 are then etched off both the bipolar devices, followed by the deposition of a polysilicon emitter contact layer 68 over the substrate to a thickness of about 3,000 Angstroms. A resist mask and implant is performed at this point to provide any desired poly resistors. P+ and N+ implants are made into the polysilicon over and surrounding the emitter areas of the PNP and NPN devices 4 and 6, respectively, through openings in corresponding photoresist masks. These implantations make the polysilicon 68 conductive in the emitter regions, and also extends into the previously lightly doped base regions 64 and 66 to establish emitters 70 and 72, respectively. The thermal oxide layer 56 surrounding the emitter areas serves as a diffusion-barrier, causing the implanted emitter regions 70 and 72 to self-align with their respective base regions. The bird's-beak profile at the inner edge of the thermal oxide layer smoothes out the distribution of the implant, as mentioned above.

The invention also allows for the fabrication of capacitors simultaneously with the transistors. The conductive polysilicon layer 44 could be patterned at a capacitor location to serve as one capacitor electrode, with the oxide and nitride layers 46 and 48 serving collectively as the capacitor's dielectric. The capacitor's upper electrode is formed by patterning the doped emitter contact polysilicon layer 68 on top of the capacitor dielectric, as well as on the bipolar emitter regions.

After removing the photoresist masks used in the emitter implants, another mask is formed over the polysilicon layers 68 and used to etch away the polysilicon 68 except in the areas over the bipolar emitters and base contact region. The remaining doped polysilicon layers serve as emitter and base contacts to their respective bipolar devices. At this point the bipolar transistors are also complete, and contact metallizations need only be made to the various devices in a conventional manner to complete the circuit.

Figure 12:
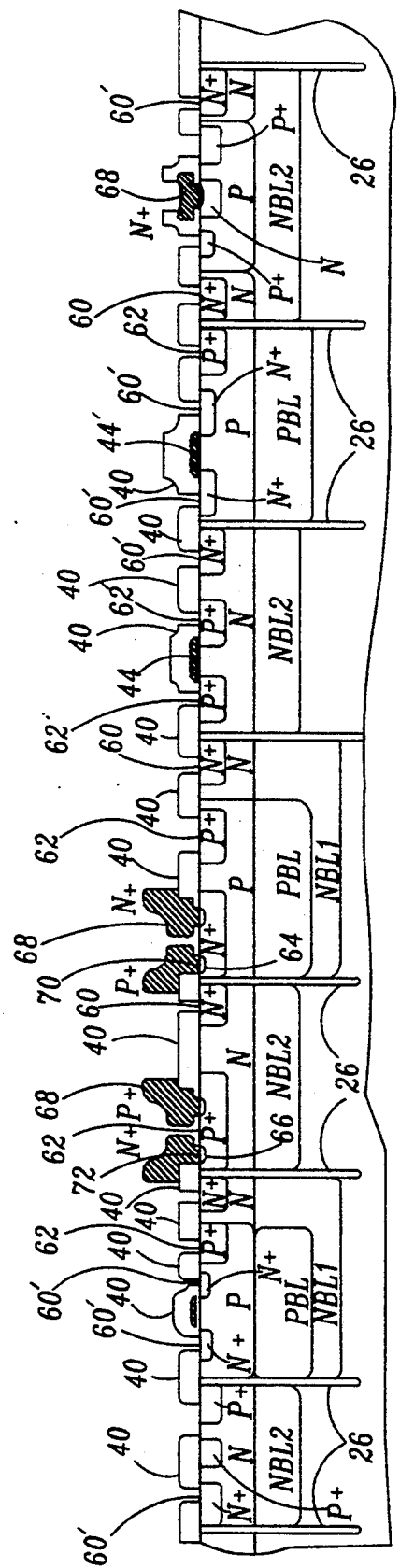
FIG. 12 is a sectional view similar to FIGS. 1 and 2, showing the completed bipolar and CMOS devices.

FIG. 12 is a sectional view similar to FIGS. 1 and 2, showing the transistors in their completed state. In this view the common fabrication steps used for the CMOS and bipolar devices can be easily visualized. The same reference numbers are used for the CMOS devices as for the bipolar devices to indicate elements that were formed in common, with a prime added to the CMOS numbers for clarification. Thus, the CMOS gates 44' and gate oxide layers 42' correspond to the polysilicon layers 44 and oxide layers 42 that were used in the initial fabrication of the bipolar devices, but later removed; the NMOS source and drain implants 60' were performed in common with the bipolar NPN external base region 60; and the PMOS source and drain regions 62' were implanted in a common step with the bipolar NPN external base region 62. N+ implant 60' is also provided for the PMOS device and a P+ implant 62' for the NMOS device as substrate contacts to keep the substrates and sources of their respective devices at the same potential. A similar reference number system is used to identify the elements of the isolated NMOS, P-JFET and Schottky devices. In all cases the field oxide is identified by reference number 40, and the devices are separated by isolation trenches 26.

One of the advantages of the invention is that it allows the external bases of the bipolar devices to be kept very close to the intrinsic base regions immediately below the emitter, thereby reducing the total base resistance. Because of the self-aligned fabrication, the transistors can be scaled to very small sizes, leading to a corresponding reduction in undesired capacitances.

The invention also contemplates a new fabrication process for precision NiCr resistors that results in lower contact resistances. The method, which is performed after the fabrication of the transistor devices as described above in the first metallization layer, is illustrated in FIGS. 13a and 13b. In the first step a thin film of NiCr 74, preferably 200 Angstroms, is deposited over the substrate and topped with a sacrificial layer of TiW 76, preferably about 500 Angstroms thick. The desired resistor shape is then patterned in the two films 74 and 76 with a wet edge. This is followed by the deposition of another TiW layer, preferably about 2,000 Angstroms thick, and then a metallization such as 1 micron thick Al-Si. The metallization and TiW are patterned to form contacts 78 and 80 at opposite ends of the resistor 74, as shown in FIG. 13b. Each contact pad consists of a 500 Angstrom pad of TiW 76, a 2,000 Angstrom layer of TiW 82, and the second metallization Al-Si contact 84. Most of the original TiW layer over the resistor is removed during the second metallization layer's dry etch, and the remainder is thereafter removed with a wet etch.

Although theoretically the full 2,500 Angstrom TiW layer could be deposited initially over the resistor, this has been found to make it too difficult to pattern the resistor. Separating the TiW deposition into two steps, with a smaller layer deposited first before the resistor is patterned, makes the fabrication process feasible. The use of a TiW interface between the metallization and NiCr resistor has been found to result in a significant improvement in the contact resistance.

While a particular embodiment of the invention has been shown and described, numerous variations and alternate embodiments will occur to those skilled in the art. Accordingly, it is intended that the invention be limited only in terms of the appended claims.

We claim:

1. A BiMOS (bipolar metal oxide semiconductor) transistor fabrication method, said method comprising the steps of:

forming common MOS gate contact layers over bipolar transistor emitter and MOS transistor gate areas on a semiconductor substrate, retaining said gate contact layer over said gate area as a MOS transistor gate contact, performing a dopant implant into said substrate to form an external base for said bipolar transistor around its associated gate contact layer, forming source and drain regions for said MOS transistor, and a collector region for said bipolar transistor that is spaced from said gate contact layer over the emitter area, removing said gate contact layer from over the bipolar transistor emitter area, forming vertically aligned base and emitter regions for said bipolar transistor, and forming a common patterned non-metal contact layer over said emitter region and said external base to serve as an emitter and an external base contact, respectively.

2. The BiMOS fabrication method of claim 1, further comprising the steps of forming common gate oxide layers over said gate and emitter areas prior to the formation of said common gate contact layers, and removing the gate oxide layer from said emitter area after removing said gate contact from said emitter area but retaining the gate oxide layer in said gate area under the gate contact layer.

3. The BiMOS fabrication method of claim 2, wherein said base and emitter regions are formed by respective base and emitter implants into said emitter area after removal of said gate contact layer from said emitter area.

4. The BiMOS fabrication method of claim 1, further comprising the steps of forming a implantation mask over and surrounding the emitter's gate contact layer prior to the implantation of said external base, and thereafter removing said mask in conjunction with the removal of said gate contact layer from over said emitter area.

5. The BiMOS fabrication method of claim 4, wherein a base-link portion of said base region is implanted in said substrate prior to forming said implantation mask, using said gate contact layer over the emitter area to pattern said base-link implantation, wherein at least one portion of said implantation mask that surrounds the emitter's gate contact layer overlies said base-link portion.

6. The BiMOS fabrication method of claim 5, wherein a lightly doped drain implant is made for said MOS transistor using the same mask and implant step as for said base-link implantation.

7. The BiMOS fabrication method of claim 1, wherein a source/drain implant is made for said MOS transistor concurrently with said external base implant, using a common mask.

8. The BiMOS fabrication method of claim 1, further comprising the concurrent formation of complementary bipolar transistors, wherein said common patterned non-metal contact layer is formed over the emitter and external base areas of both npn and pnp bipolar transistors.

9. The BiMOS fabrication method of claim 1, further comprising the concurrent formation of complementary MOS transistors.

10. A BiMOS (bipolar metal oxide semiconductor) transistor fabrication method, said method comprising the steps of:

forming common MOS gate contact layers over bipolar transistor emitter and MOS transistor gate areas on a semiconductor substrate, retaining said gate contact layer over said gate area as a MOS transistor gate contact, performing a dopant implant into said substrate to form an external base for said bipolar transistor around its associated gate contact layer, forming source and drain regions for said MOS transistor, and a collector region for said bipolar transistor that is spaced from said the gate contact layer over the emitter area, heating said substrate to form a thermal oxide layer on said substrate;

using said gate contact layer over the emitter area as an oxidation mask for said emitter area during said heating;

removing said gate contact layer from over the bipolar transistor's emitter, forming vertically aligned base and emitter regions for said bipolar transistor, and forming another contact layer over said emitter region to serve as an emitter contact.

11. The BiMOS fabrication method of claim 10, further comprising the step of forming a non-oxidizable spacer layer around the vertical sides of the said emitter gate contact layer prior to said heating step, said spacer layer constraining said thermal oxide layer to terminate in a bird's beak profile around the emitter edge.

* * * * *